United States Patent
Kiesewetter et al.

(10) Patent No.: US 9,395,411 B2
(45) Date of Patent: Jul. 19, 2016

(54) METHOD FOR TESTING A TEST SUBSTRATE UNDER DEFINED THERMAL CONDITIONS AND THERMALLY CONDITIONABLE PROBER

(71) Applicant: Cascade Microtech, Inc., Beaverton, OR (US)

(72) Inventors: Joerg Kiesewetter, Thiendorf OT Sacka (DE); Stojan Kanev, Thiendorf OT Sacka (DE); Michael Teich, Friedewald (DE); Karsten Stoll, Sohland an der Spree (DE); Axel Schmidt, Thiendorf OT Stoelpchen (DE)

(73) Assignee: CASCADE MICROTECH, INC., Beaverton, OR (US)

( * ) Notice: Subject to any disclaimer, the term of this patent is extended or adjusted under 35 U.S.C. 154(b) by 372 days.

(21) Appl. No.: 13/953,545

(22) Filed: Jul. 29, 2013

(65) Prior Publication Data

US 2014/0028337 A1 Jan. 30, 2014

Related U.S. Application Data

(63) Continuation of application No. 12/681,806, filed as application No. PCT/EP2008/063154 on Oct. 1, 2008, now Pat. No. 8,497,693.

(30) Foreign Application Priority Data

Oct. 10, 2007 (DE) .......................... 10 2007 048 815

(51) Int. Cl.
*G01R 31/00* (2006.01)
*G01R 31/28* (2006.01)

(52) U.S. Cl.
CPC ........ *G01R 31/2891* (2013.01); *G01R 31/2874* (2013.01)

(58) Field of Classification Search
CPC .......... G01R 31/2874; G01R 31/2886; G01R 31/2875; G01R 31/2891; G01R 31/318511; G01R 1/44; G01R 31/281; G01R 31/2851; G01R 31/2862; G01R 31/2881
See application file for complete search history.

(56) References Cited

U.S. PATENT DOCUMENTS

| | | |
|---|---|---|
| 5,124,639 A | 6/1992 | Carlin et al. |
| 5,220,277 A | 6/1993 | Reitinger |

(Continued)

FOREIGN PATENT DOCUMENTS

| | | |
|---|---|---|
| DE | 4109908 | 10/1992 |
| DE | 10246282 | 4/2004 |
| DE | 102005001163 | 5/2006 |

OTHER PUBLICATIONS

International Search Report for PCT/EP2008/063154 dated Mar. 19, 2009.

*Primary Examiner* — Tung X Nguyen
(74) *Attorney, Agent, or Firm* — Dascenzo Intellectual Property Law, P.C.

(57) ABSTRACT

In a method and a device for testing a test substrate under defined thermal conditions, a substrate that is to be tested is held by a temperature-controllable chuck and is set to a defined temperature; the test substrate is positioned relative to test probes by at least one positioning device; and the test probes make contact with the test substrate for testing purposes. At least one component of the positioning device that is present in the vicinity of the temperature-controlled test substrate is set to a temperature that is independent of the temperature of the test substrate by a temperature-controlling device, and this temperature is held constant.

9 Claims, 5 Drawing Sheets

(56) References Cited

U.S. PATENT DOCUMENTS

| | | | |
|---|---|---|---|
| 5,653,539 A * | 8/1997 | Rosengaus | G01K 11/20 |
| | | | 250/361 C |
| 6,111,421 A * | 8/2000 | Takahashi | G01R 31/2868 |
| | | | 324/750.04 |
| 6,130,543 A | 10/2000 | Iino | |
| 7,405,584 B2 | 7/2008 | Fujita et al. | |
| 7,671,615 B2 | 3/2010 | van de Beek et al. | |
| 7,900,373 B2 | 3/2011 | Reitinger | |
| 2004/0108847 A1 | 6/2004 | Stoll et al. | |
| 2006/0158207 A1 | 7/2006 | Reitinger | |
| 2007/0132469 A1 | 6/2007 | Yano | |

* cited by examiner

METHOD FOR TESTING A TEST SUBSTRATE UNDER DEFINED THERMAL CONDITIONS AND THERMALLY CONDITIONABLE PROBER

CROSS REFERENCE TO RELATED APPLICATIONS

This application is a continuation of U.S. patent application Ser. No. 12/681,806, filed on Aug. 2, 2010, issued as U.S. Pat. No. 8,497,693 on Jul. 30, 2013, and which is a national stage filing under Section, 371 of International Application No. PCT/EP2008/063154 filed on Oct. 1, 2008, and published in German on Apr. 23, 2009 as WO 2009/050038 and claims priority of German application No. 10 2007 048 815.9 filed on Oct. 10, 2007, the entire disclosure of these applications being hereby incorporated herein by reference.

BACKGROUND ART

The invention relates to a method for thermally conditioning a prober that serves to check and test electronic components at defined temperatures. The invention also relates to a prober to execute the thermal conditioning.

A prober is defined hereinafter as a test device that measures the electrical functions of electronic components. A prober is used for checking or testing a wide variety of electronic components in various production stages. For example, these components can be semiconductor components in the wafer composite or individual components, like semiconductor chips, hybrid components, micro-mechanical or optical components or the like, for which reason the electronic components that are to be tested shall be referred to hereinafter as simply the test substrate.

A test substrate of this type generally exhibits a smooth and planar underside and is arranged and held, at least indirectly, on a chuck, which is an essential part of the prober and has a smooth and planar receiving surface for receiving the test substrate. The test substrate can be displaced with the chuck in the working area by means of a chuck drive, so that it can be positioned in relation to the test probes of the prober. The positioning of the test substrate is generally effected in the horizontal plane—that is, the X-Y plane—by means of a cross table as well as by means of a device for an angular orientation in a range of a few degrees and by means of a vertical—that is, Z lift—that makes possible, for example, an infeed movement of the test substrate in the direction of the test probes that are arranged above the test substrate.

Moreover, the holders of the test probes also exhibit their own positioning device, with which, for example, a plurality of test probes can be oriented relative to each other or to a preferential direction of the test substrate in the X, Y and Z direction, or an infeed movement to the test substrate can be effected.

For testing purposes the test probes, which have the form of contacting needles, make contact with the test substrate, to which test signals are applied or from which test signals are picked off. The test signals can vary widely. For example, the output signals can be generated by other input variables, such as radiation in a number of wavelength ranges, for example. The test probes are generally located outside the working area on the upper closure of the housing and make contact with the test substrate through an aperture in the housing.

The operational reliability of electronic components is tested in probers preferably under the environmental conditions that correspond to the conditions of use of the component in question. In this context the setting of the test substrate to defined temperatures is a main focus. The temperature of the test substrate is set by way of the chuck that can be heated or cooled by means of suitable devices.

In order to set the test conditions, the working area of the prober is generally surrounded by a housing. Such a prober surrounded by a housing is known from DE 4109908 C2. In this prober the housing exhibits a plurality of inlet openings in the lower section and an additional opening that serves as both an outlet opening and to provide the test probes access in the upper closure of the housing. When testing in the lower temperature range, a gas flow is provided through the working area by means of these openings, in order to prevent the precipitation of moisture from the surrounding atmosphere on the test substrate.

In order to reach the temperature, at which the test substrate is supposed to be tested, a suitable coolant is applied to the chuck. In order to adjust the temperature or to set even more controlled test conditions at the chuck, said chuck is connected to the corresponding sources, located outside the working area, by way of media lines. Whereas in this prober the chuck drive is also cooled as a result of the heat exchange with the chuck, DE 102 6 282 A1 describes a prober, in which the receiving surface of the chuck and the chuck drive are thermally almost decoupled, and the test substrate is shielded against the thermal radiation of the surrounding uncooled components by means of a directly cooled thermal radiation shield. In contrast to the former prober, the thermal separation could significantly reduce the amount of time and effort it takes to position the chuck with the accuracy and repeatability necessary for the test substrate, because the measuring time is significantly influenced by the onset of a thermal equilibrium in the measurement environment, and this environment was minimized. However, even in the case of the latter prober it was found that as the measuring time advances, the sequence of movements changes as a result of a progressive change in the thermal conditions of the positioning devices, thus adversely affecting to varying degrees the accuracy and repeatability of the test at different temperatures and different time lapses.

BRIEF SUMMARY OF INVENTION

Working on this basis, the invention is based on the problem of providing a prober that is intended for testing substrates at defined temperatures and in which spatially and thermally defined and repeatable test conditions for the test substrate and for the components of the prober that are connected to the test substrate are to be set and maintained with a minimum loss of time.

According to aspects of the disclosure, the problem may be solved utilizing the probers and methods recited in the claims. In some embodiments, a prober may include a temperature-controlled chuck, a plurality of test probes that are configured to electrically contact a test substrate that is supported by the temperature-controlled chuck, a positioning device that positions the test substrate relative to the plurality of probes, and a viewing unit that is configured to view the test substrate during the test. In some embodiments, the viewing unit includes a drive that is configured to position the viewing unit relative to the test substrate and a temperature control device that is configured to maintain the temperature of the drive. In some embodiments the desired temperature is independent of the temperature of the test substrate. In some embodiments, the viewing unit further includes a microscope. In some embodiments, the viewing unit further includes a camera. In some embodiments, the methods include orienting the viewing unit relative to the test substrate with the drive, viewing the test substrate, and maintaining the drive at the desired temperature. In some embodiments, the method further includes changing the temperature of the test substrate while maintaining the temperature of the drive during the changing. In some embodiments, the methods include contacting the test substrate with a plurality of test probes, and in some embodiments, the methods include viewing at least a portion of the plurality of test probes with the viewing unit.

BRIEF DESCRIPTION OF DRAWING FIGURES

The invention is explained in detail below in conjunction with exemplary embodiments. In the respective drawings FIGS. 1 and 2 depict a prober with a housing according to the state of the art;

DETAILED DESCRIPTION

Figure 1:
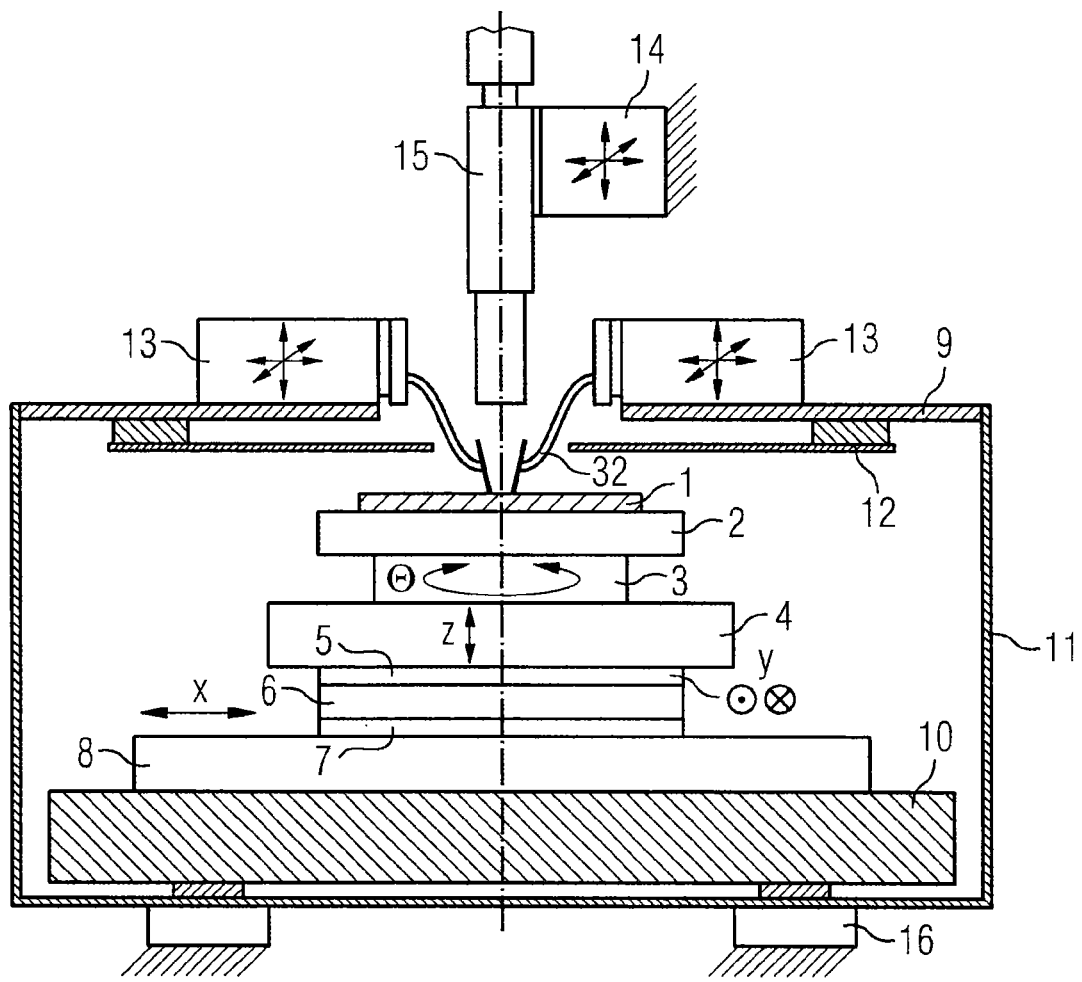

A prober, according to the state of the art for testing a test substrate that can be set to a defined temperature for testing purposes, exhibits a temperature controllable chuck 2 inside a housing 11 that is designed as an EMC shield. Said chuck can be cooled and/or heated so that a test substrate—for example, a wafer—mounted on said chuck can be set to a temperature that can be at a few hundred degrees or also in the low temperature range.

The chuck 2 exhibits a chuck drive, with which the test substrate 1 can be moved in the X, Y and Z direction as well as rotated about an angle theta. The movements in the X and Y direction are executed in each case by an X or Y carriage 7 or 5 respectively in connection with an X or Y stator 8 or 6 respectively; and the movement in the Z direction is executed by a Z drive 4 and the rotation is executed by a theta drive 3. The chuck drive including the chuck and the test substrate mounted thereon are arranged on a base plate 10 for stabilization purposes. The housing itself is mounted on a frame 16.

The upper closure of the housing 11 forms a probe holder plate 9, on which the probe holders with the test probes 32 are mounted. Each probe holder, according to FIG. 1, exhibits a manipulator, which serves to position the test probes 32 in the X, Y and Z direction. The probe holders with the manipulators are commonly called probe heads 13.

Both the chuck drive and the manipulators of the probe holder serve to position the test substrate 1 relative to the test probes 32 and are, therefore, components of the positioning device of the prober. In this case the chuck drive itself also consists of the above-described components that execute the individual directions of movement. The positioning device of the prober may also comprise fewer or additional components as a function of the design concept for the sequence of movements in a prober.

In order to achieve EMC shielding of the test substrate 1 in relation to the probe heads 13, a plate-shaped EMC shield 12 is mounted below the probe holder plate 9 and over the test substrate 1. The positioning of the tips of the test probes 32 on the test substrate 1 and the testing itself can be viewed with a microscope 15, which can be combined with a camera. For this purpose the microscope 15 is mounted over an aperture in the probe holder plate 9 and the EMC shield 12 and can be moved in the X, Y and Z direction by means of its own microscope drive 14.

Figure 2:
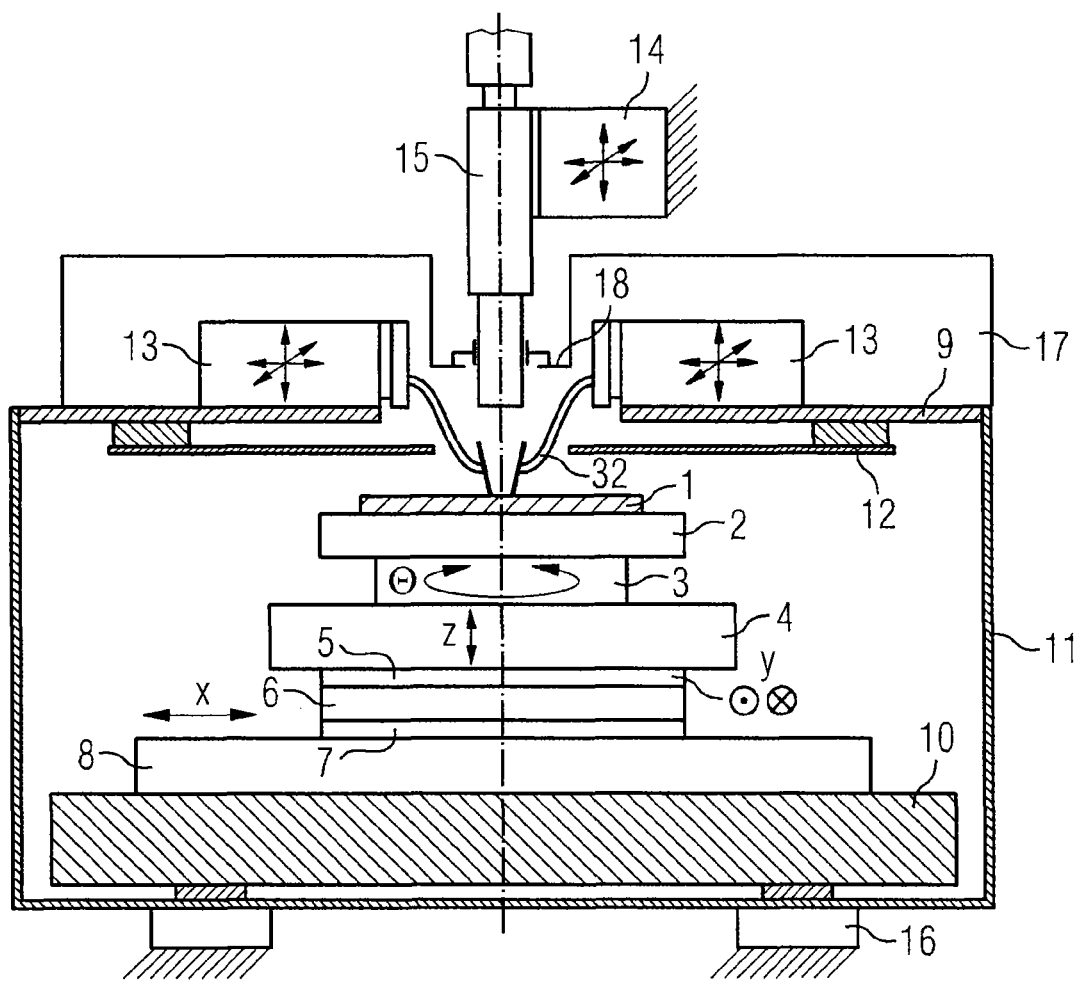

FIG. 2 shows an embodiment of a prober from FIG. 1. The prober, according to FIG. 2, has, in addition to the above-described components, top chambers 17, which envelop the probe heads and form a total closure of the prober volume in relation to the surrounding atmosphere. The closure in relation to the microscope is achieved with an objective lens seal 18. A configuration of this type is used, for example, to conduct tests at lower temperatures.

Figure 3:
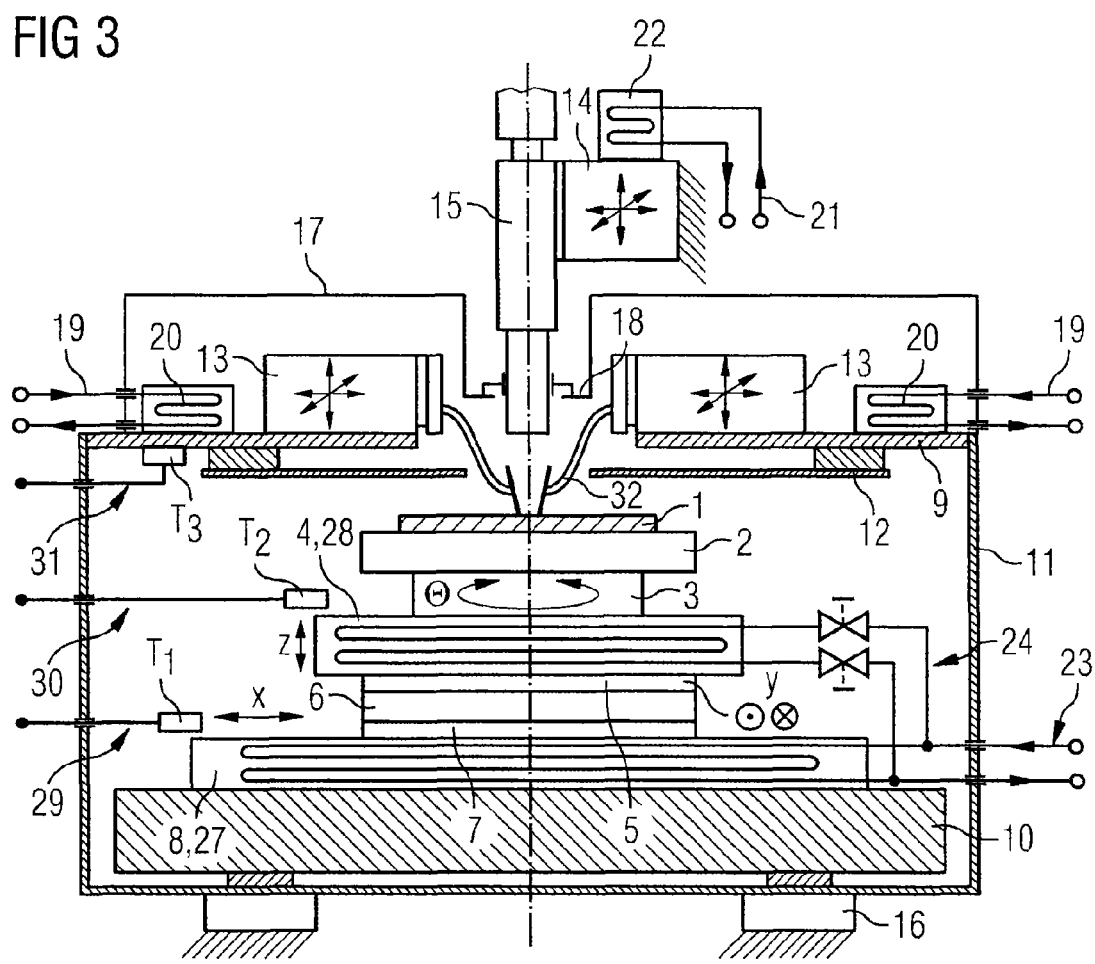
FIG. 3 depicts a prober comprising a housing and temperature controlling devices with heat exchangers for all of the components of a positioning device.

FIG. 3 shows a prober from FIG. 2, to which were added temperature controlling devices for all of the components of the positioning device. The inventive prober in FIG. 3 exhibits an X stator 8, which comprises a heat exchanger 27 that can heat or cool the X and Y stator as well as the X and Y carriage. For this purpose a temperature-controlling fluid is conveyed through the heat exchanger over an inflow and an outflow line 23. The Z drive is temperature controlled in the same way. In the embodiment shown the inflow and outflow lines of the temperature-controlling fluid for the Z and theta drive 24 branch off from the inflow and outflow lines for the X and Y drive 23, in order to set all of the drives to the same temperature without the need for more complex control systems. Of course, in this case it is also possible to use separate fluid cycles, so that the temperature of the individual components of the chuck drive can be set separately from each other.

In any case, however, it is possible to set the temperature of the components of the positioning device independently of the temperature setting of the chuck 2 and, therefore, of the test substrate 1. In this way the set temperature of the chuck drive can deviate significantly from that of the test substrate, so that it is possible to adjust in a defined manner the thermal expansion properties of the materials of the chuck drive. The defined adjustment of the expansion property by way of the temperature of the components includes both the minimization of the thermal expansion at temperatures close to the ambient temperature and also thermal conditions that significantly deviate therefrom. Nevertheless, as a result of the temperature that is held constant, the said thermal conditions remain constant and, hence, calculable over the entire test period, independently of the onset of a thermal equilibrium with the other components of the prober.

Insofar as the set temperature of the chuck drive that is held constant deviates significantly from the temperature that after a longer period of time would have reached a thermal equilibrium as a result of the heat exchange, it is still necessary to continue the temperature controlling operation. If, however, the equilibrium temperature is known or can be determined, for example, by sampling, then one embodiment of the method provides that this equilibrium temperature be set in a targeted manner by means of temperature controlling devices and be actively maintained until a state of thermal equilibrium is produced. In this case the equilibrium temperature is reached significantly faster than in the case of a natural thermal equilibrium—that is, in the period of time, in which the test substrate is also temperature controlled. This embodiment has the advantage that especially during longer test periods the energy input can be reduced, because the active temperature controlling period can be shortened and the only factor that has to be guaranteed is that the set temperature can be maintained.

In order to set and control the temperature of individual components, all of the temperature-controlled components have temperature sensors 29, 30, 31 that can be a measuring element of the control circuit.

Figure 4:
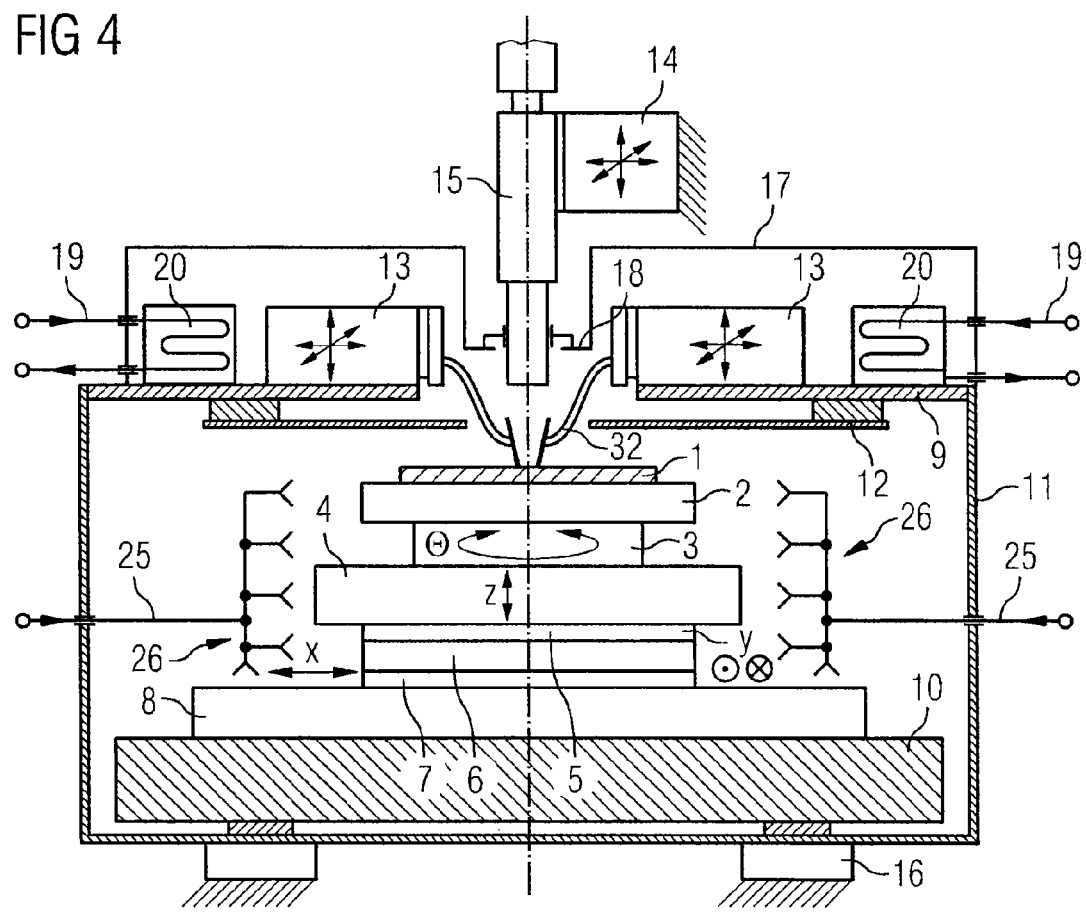
FIG. 4 depicts a prober comprising a housing and a variety of temperature controlling devices for all of the components of a positioning device and FIG. 5 depicts a prober that is shown in FIG. 4, but the probe holder and its manipulators are arranged outside the housing.

The prober, according to FIG. 3, also has heat exchangers 20 for the probe holder plate. A temperature controlling fluid also flows through these heat exchangers. In this way the thermal contact controls the temperature of the probe heads 13 with their manipulators. In order to set the potential temperatures, reference is made to the above description for controlling the temperature of other components of the positioning device. This approach makes it possible to prevent a change in the positioning of the test probes 32 on the test substrate 1 as a result of a change in the thermal expansion in the course of the heat balancing processes during the testing. The same can also be achieved for the viewing unit 15 in that its drive 14 also has a temperature controlling device 22. At the same time this temperature control process does not have an impact on the positioning, but rather only on the viewing position. For this reason it is also possible to dispense, as an alternative, with such a temperature control of the microscope drive (FIG. 4).

An additional embodiment of the invention also provides the above-described options for setting defined temperatures by means of a temperature-controlled gas flow. In this case the outflow elements 26 aim the gas flow at the respective component of the positioning device. In this way the entire chuck drive can be cooled or heated, as shown in FIG. 4, by means of a common temperature controlling device. Of course, the various temperature controlling devices—that is, the heat exchangers or the gas flow device—can be combined in a logical way for the various components of the positioning device of the prober (FIG. 4).

Figure 5:
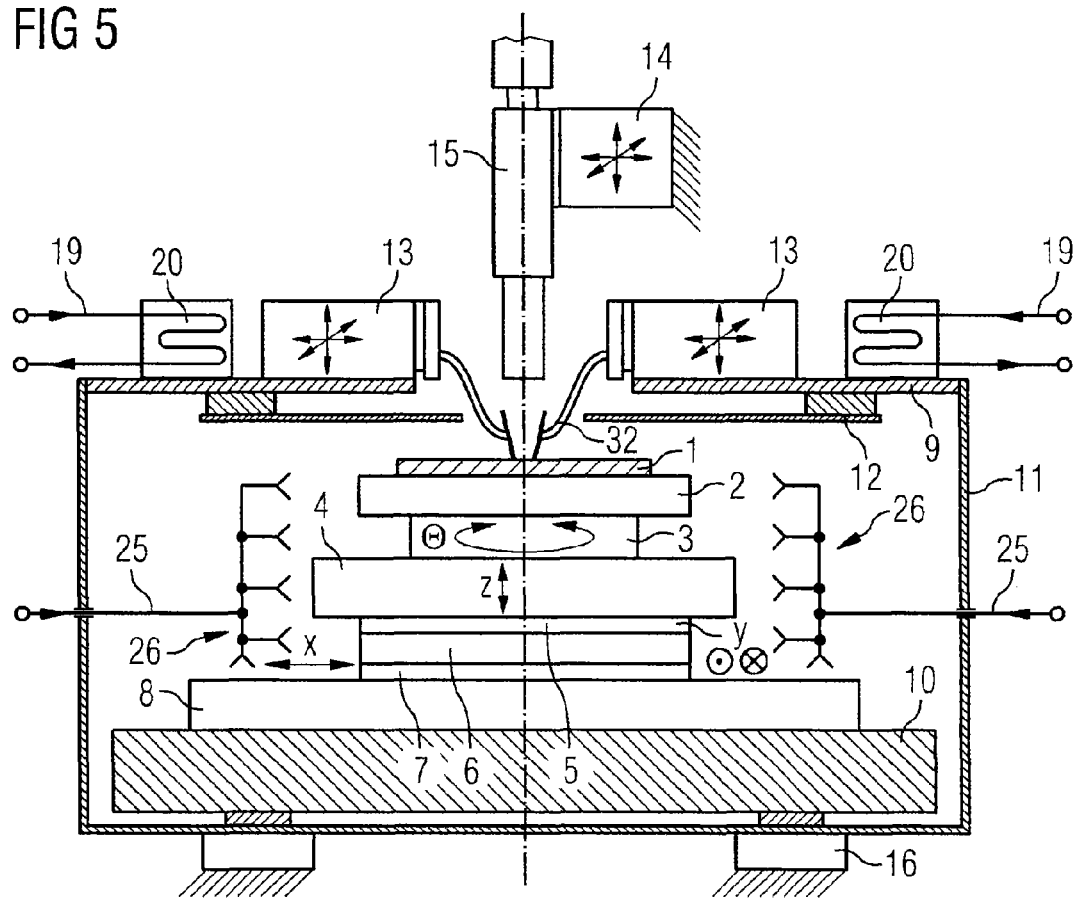

Furthermore, it is also possible to use the described temperature-controlling devices for a variety of prober designs. FIG. 5 shows an inventive prober, in which the chuck drive is temperature-controlled via heat exchangers by means of a gas flow and the probe holder plate 9, but the probe heads 13 are disposed outside the housing.

The invention claimed is:

1. A prober that is configured to test a test substrate, the prober comprising:
    a temperature-controlled chuck that is configured to support the test substrate and to control a temperature of the test substrate;
    a plurality of test probes that are configured to electrically contact the test substrate;
    a positioning device that is configured to position the test substrate relative to the plurality of test probes; and
    a viewing unit that is configured to view the test substrate during the test, wherein the viewing unit includes:
    (i) a drive that is configured to position the viewing unit relative to the test substrate; and
    (ii) a temperature control device that is configured to maintain the temperature of the drive at a desired temperature that is independent of the temperature of the test substrate.

2. The prober of claim 1, wherein the viewing unit further includes a microscope.

3. The prober of claim 1, wherein the viewing unit further includes a camera.

4. A method of testing a test substrate under defined thermal conditions, the method comprising:
    locating the test substrate on a temperature-controlled chuck that is configured to support the test substrate and to control the temperature of the test substrate to a test temperature;
    orienting a viewing unit relative to the test substrate with a drive;
    viewing the test substrate with the viewing unit; and
    maintaining the drive at a desired temperature that is independent of the temperature of the test substrate.

5. The method of claim 4, wherein the test temperature is a first temperature, wherein the method further includes changing the temperature of the test substrate to a second temperature that is different from the first temperature, and further wherein the maintaining includes maintaining the drive at the desired temperature during the changing.

6. The method of claim 4, wherein the method further includes contacting the test substrate with a plurality of test probes.

7. The method of claim 6, wherein the viewing further includes viewing at least a portion of the plurality of test probes.

8. The method of claim 4, wherein the viewing unit includes a microscope.

9. The method of claim 4, wherein the viewing unit includes a camera.

* * * * *